United States Patent [19]

Schröder

[11] 4,353,035
[45] Oct. 5, 1982

[54] CIRCUIT FOR COMPRESSION OR EXPANSION OF AN ELECTRICAL SIGNAL

[75] Inventor: Ernst Schröder, Hanover, Fed. Rep. of Germany

[73] Assignee: Licentia Patent-Verwaltungs G.m.b.H., Frankfurt am Main, Fed. Rep. of Germany

[21] Appl. No.: 148,933

[22] Filed: May 12, 1980

[30] Foreign Application Priority Data

May 12, 1979 [DE] Fed. Rep. of Germany ....... 2919280

[51] Int. Cl.³ .......................... H03F 3/68; H04B 1/64
[52] U.S. Cl. .................................. 330/126; 330/86; 330/284; 333/14; 455/72

[58] Field of Search ................... 330/51, 126, 86, 144, 330/284; 333/14; 455/72

[56] References Cited

U.S. PATENT DOCUMENTS

| 2,287,077 | 6/1942 | Abraham | 333/14 |
| 4,114,115 | 9/1978 | Minnis | 330/86 |
| 4,218,662 | 8/1980 | Schröder | 330/86 |

Primary Examiner—James B. Mullins
Assistant Examiner—Gene Wan
Attorney, Agent, or Firm—Spencer & Kaye

[57] ABSTRACT

In a two-band compander pre-emphasis is carried out during compression and de-emphasis during expansion in the lower frequency range. Noise suppression is improved by this measure.

7 Claims, 1 Drawing Figure

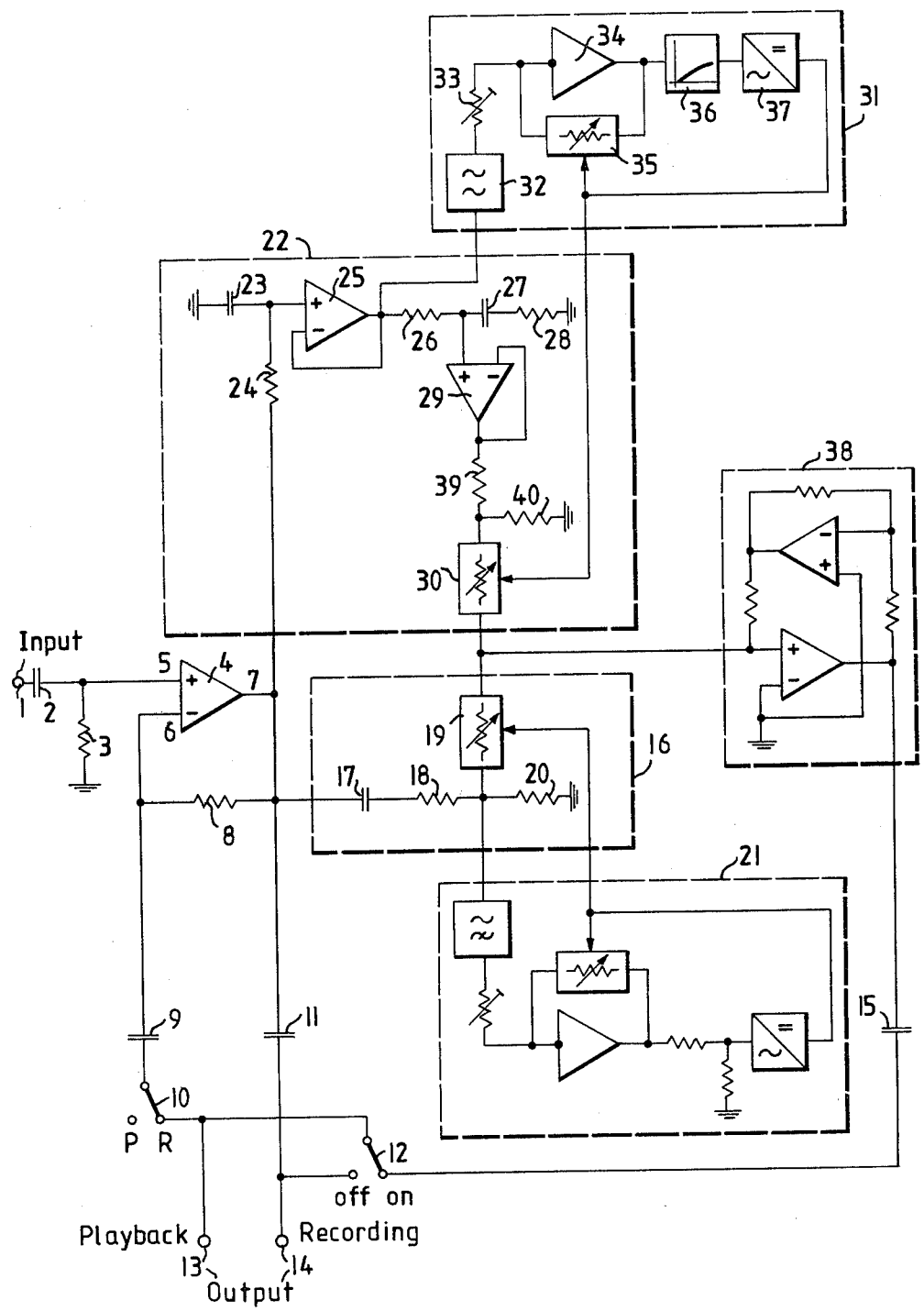

CIRCUIT FOR COMPRESSION OR EXPANSION OF AN ELECTRICAL SIGNAL

BACKGROUND OF THE INVENTION

The invention relates to a circuit for compression or expansion of an electrical signal.

Companders are used to improve the signal-to-noise ratio during a signal transmission across long distances and during signal storage. The mode of operation consists of raising or emphasizing weak signals in terms of their level before transmission or storage and in lowering or de-emphasizing them after transmission or reproduction. Thus interference signals also on the transmission paths are also lowered or de-emphasized. Moreover, interference signals may be obscured by useful signals to a greater or lesser extent. This obscuring or masking effect is a physiological phenomenon and depends on how much the useful signal and the interference signal differ in frequency from each other. Therefore it is advisable to subdivide the low frequency spectrum into several frequency selective channels and to control the effective transmission factor in these channels only in dependence on the useful signals occurring therein. A masking effect which would be sufficient for professional purposes may be achieved with four frequency selective channels. For semi-professional and consumer purposes, a lower cost is desirable. Considering that the cost is approximately proportional to the number of channels the restriction to two channels is sensible for semi-professional purposes.

However, it has proved that one such compander, which was conceived according to the principles of a four-channel compander—with the exception of the other crossover frequencies—already has a noise effect in the case of certain extreme signal performance, e.g. strong spectrally pure signals in the base note range. If it were only important to process these signals free of noise then the crossover frequency of the two compander channels could be lowered. However, this results in unfavourable noise characteristics in the treble range.

SUMMARY OF THE INVENTION

The object underlying the invention is to improve the process of freeing low frequency signals of interference and noise based on subdivision of the transmission range into two frequency ranges with subjectively approximately the same noise output.

According to a first aspect of the present invention there is provided a circuit for compressing or expanding electrical signals comprising at least two frequency channels, and a combining circuit for the output of the channels, the lower frequency channel comprising means for emphasising higher frequency signals during compression of electrical signals, and means for de-emphasising higher frequency signals during expansion of electrical signals.

According to a second aspect of the present invention there is provided a circuit for optional automatic dynamic range compression or expansion including subdivision of the frequency spectrum into several frequency selective channels containing adjusting elements for controlling the effective transmission factor and including a combining circuit for the outputs of the channels, wherein a low frequency channel contains a high frequency emphasis network in the "compression" type of operation and a high frequency de-emphasis network in the "expansion" type of operation.

BRIEF DESCRIPTION OF THE DRAWING

A preferred embodiment of the present invention will now be described, by way of example only, with reference to the accompanying FIGURE of the drawing which shows a compander circuit in accordance with the present invention.

DESCRIPTION OF THE PREFERRED EMBODIMENT

The following considerations take part in the solution in accordance with the invention: the noise output allocated to a frequency interval increases as the frequency increases. The amplitude statistics of conventional audio signals show a lower amplitude path in the middle and high frequency range than in the lower frequency range. It was discovered that the higher frequency signal components are also weaker in the low frequency compander channel than are the low frequency signal components. From these considerations the conclusion was drawn that a higher suppression of noise may be achieved if signal companding takes place in the upper frequency range of the low frequency channel in the case of smaller signal amplitudes than in the low frequency range. An increase in noise pumping in the low frequency range due to this measure should not be expected effectively because of the weaker high frequency signal components.

The drawing shows a circuit for optional automatic dynamic range compression or expansion with subdivision of the frequency spectrum into two channels. The input signals are supplied to the compander via an input terminal 1 and are applied to the non-inverting input 5 of a differential amplifier 4 via a capacitor 2. A resistor 3 is arranged between the non-inverting input 5 and earth and serves to set a certain input resistance. A negative feedback path is supplied from the output 7 of the differential amplifier 4 to the inverting input 6. In the "compression" type of operation the negative feedback path for the upper frequency band passes via a controllable filter arrangement 16 and for the lower frequency band via a controllable filter arrangement 22 to a combining circuit 38. The combining circuit 38 is formed as a non-inverting summing amplifier. Another negative feedback path runs from the output of the combining circuit via a capacitor 15, a first switch 12, a second switch 10 and a further capacitor 9, to the inverting input 6 of the differential amplifier 4. A direct negative feedback signal path of the amplifier 4 is interrupted by the low-resistance output of the combining circuit 38 by means of a resistor 8. This path only serves additionally to set the operating point.

The signal path runs from the output 7 of the differential amplifier 4 via a capacitor 11 to an output terminal 14. In the "compression" type of operation the compressed useful signals may be tapped at this output terminal. In the "expansion" type of operation the switch 10 is put into the position which is not shown in the drawing. The negative feedback path of the differential amplifier 4 then passes from the output 7 via the resistor 8 to the inverting input 6. The circuit elements which lie in the negative feedback path during the "compression" type of operation are arranged in the signal path during "expansion". The signal path runs from the output 7 of the differential amplifier 4 via the controllable filter arrangements 16, 22 already mentioned to the combining circuit 38 during the "expansion" type of operation. The signal path runs from the output of the combining circuit via the capacitor 15 and the switch 12 to an output terminal 13.

If the switch 12 is brought into the position which is not shown in the drawings then the compander is ineffective and the input signals applied to the input terminal 1 are passed to the output terminals 13 and 14 at constant amplification via the differential amplifier 4 and the capacitor 11.

Control of the effective transmission factor in each controllable filter takes place via a branch path associated with the filter arrangements in each case, said branch path having a control voltage generator. A branch path 21 is provided for the high frequency channel and a branch path 31 is provided for the low frequency channel. The branch paths are constructed largely the same except for weighting filters applied to their inputs and the control voltage generators and the time constants in the rectifiers which serve for generating control voltage. The construction is illustrated here at the branch path for the low frequency channel. The signals reduced in dynamic range are supplied via the weighting filter 32 and a trimming potentiometer 33 to the input of the controllable amplifier 34. This amplifier may be controlled in amplification as may the corresponding controllable filter 22 by means of a variable resistor 35. Amplification is controlled so that the signals applied to the input terminal 1 are reduced at the input of the branch path 31 in the stationary condition to half the value of the dynamic range and are reduced after the amplifier 34 to the dynamic value zero. The output signals of the amplifier 34 are supplied via a weighting filter 36 to a control voltage generator 37.

The control voltage generator 37 is connected to the control inputs of the variable resistor 35 and a variable resistor 30 arranged in the controllable filter 22 and controls the resistors in the sense of a reduction in resistance as the useful signal amplitude increases. The two controllable filter arrangements subdivide the frequency spectrum into two frequency bands. The frequency characteristics are preferably so dimensioned that the frequency responses of adjacent channels intersect at −3 dB.

The channel for the high frequency band 16 contains a high-pass filter comprising a capacitor 17 and a series connection of a resistor 18 and 20. The signal is tapped from the common connection point of the resistors 18 and 20 on the one hand for the branch path 21 and on the other hand the signal is supplied direct to a variable resistor 19 which serves as an adjusting element. The variable resistor 19 is connected at its other end to the input of the combining circuit 38. The voltage divider used for matching the level of the signal to the adjusting element comprising resistors 18 and 20 is included in the frequency-determining high-pass filter.

The low frequency channel contains a low-pass filter corresponding to the high pass filter 17, 18, 20 for the purpose of separating the channel and the said low-pass filter comprises a resistor 24 and a capacitor 23. A voltage follower 25 which serves as a separating amplifier is connected to the low-pass filter. The signal for the branch path 31 is tapped from the output of the separating amplifier 25. The signal of amplifier 25 is also supplied to a network, which is also formed as a low-pass filter and has resistors 26 and 28 as well as a capacitor 27. This network has a lower limit frequency than the filter 23, 24 and serves for emphasis in the "compression" type of operation and for de-emphasis in the "expansion" type of operation. The complementary frequency characteristics required during "compression" are achieved by arranging the network in the negative feedback path of the amplifier 4 during "compression". The connection point of the resistor 26 with the capacitor 27 is connected via an impedance converter 29 and a damping element 39, 40 designed for matching the level corresponding to the damping element 18, 20 in the high frequency channel to one connection to a variable resistor 30. The other connection of the variable resistor 30 is connected to the combining circuit 38. The combining circuit 38 is formed as a non-inverting summing amplifier in order to balance out again the damping caused by the controllable filters.

The weighting filter 36 has the same frequency characteristics as the network 26, 27, 28 operating in the negative feedback operation. Thus the same frequency characteristics for the controlled chain amplifier 4 (in the low frequency channel) and 34 are achieved. This is in the interests of a straight and parallel path of the frequency-dependent characteristic groups in the compression-expansion diagram. It is not necessary for the filter 36 to be immediately in front of the rectifier 37; it may also be arranged in front of the amplifier 34 or may be formed jointly with the filter 32 which causes channel separation.

It will be understood that the above description of the present invention is susceptible to various modification changes and adaptations.

I claim:

1. A circuit for optional automatic dynamic range compression or expansion including subdivision of the frequency spectrum into several frequency selective channels containing adjusting elements for controlling the effective transmission factor and including a combining circuit for the outputs of the channels, wherein a low frequency channel contains means for controlling the transmission factor with respect to frequencies in the upper portion of the frequency band associated with the low frequency channel differently than with respect to frequencies in the lower portion of that band for causing the low frequency channel to present a high frequency emphasis network in the "compression" type of operation and a high frequency de-emphasis network in the "expansion" type of operation.

2. A circuit according to claim 1 having a control voltage generator comprising a series connection of a controllable amplifier and a rectifier circuit for feed to said adjusting elements.

3. A circuit according to claim 2 having a network similar to said high frequency emphasis network connected to the rectifier circuit as a weighting filter.

4. A circuit according to claim 1, the same network serving for emphasis and de-emphasis in both types of operation.

5. A circuit according to claim 4 wherein during "compression" said network is arranged in a negative feedback path between an output and an inverting input of a differential amplifier and during "expansion" said network is arranged in the signal path in series with said differential amplifier.

6. A circuit according to claim 1 wherein a single high-pass network serves for emphasis and/or de-emphasis in both types of operation, said network being arranged during "expansion" in the negative feedback path between an output and an inverting input of a differential amplifier and during "compression" is arranged in the signal path in series with said differential amplifier.

7. A circuit for compressing or expanding electrical signals comprising at least two frequency channels, and a combining circuit for the output of the channels, the lower frequency channel comprising means for controlling the transmission factor with respect to frequencies in the upper portion of the frequency band associated with the low frequency channel differently than with respect to frequencies in the lower portion of that band, said means emphasising higher frequency signals during compression of electrical signals, and de-emphasising higher frequency signals during expansion of electrical signals.

* * * * *